United States Patent [19]
Yen et al.

[11] Patent Number: 5,663,091
[45] Date of Patent: Sep. 2, 1997

[54] METHOD FOR FABRICATING AN ELECTRICALLY PROGRAMMABLE ANTIFUSE

[75] Inventors: Yeouchung Yen, San Jose; Shih-Oh Chen, Fremont; Hung-Kwei Hu, Saratoga, all of Calif.

[73] Assignee: Actel Corporation, Sunnyvale, Calif.

[21] Appl. No.: 644,335

[22] Filed: May 9, 1996

Related U.S. Application Data

[62] Division of Ser. No. 292,801, Aug. 10, 1994, Pat. No. 5,550,404, which is a continuation of Ser. No. 65,530, May 20, 1993, abandoned.

[51] Int. Cl.⁶ .......................... H01L 21/70; H01L 27/00
[52] U.S. Cl. .................... 437/60; 437/922; 148/DIG. 55; 438/701
[58] Field of Search .............. 437/60, 922; 148/DIG. 55

[56] References Cited

U.S. PATENT DOCUMENTS

| | | | |
|---|---|---|---|
| 3,717,852 | 2/1973 | Abbas et al. | 340/173 SP |
| 4,145,803 | 3/1979 | Tasch et al. | 29/571 |
| 4,692,787 | 9/1987 | Possley et al. | 357/59 |
| 4,800,176 | 1/1989 | Kakumu et al. | 437/193 |
| 5,095,362 | 3/1992 | Roesner | 357/23.4 |
| 5,100,827 | 3/1992 | Lytle | 437/52 |
| 5,120,679 | 6/1992 | Boardman et al. | 437/195 |
| 5,166,556 | 11/1992 | Hsu et al. | 307/465 |
| 5,171,715 | 12/1992 | Husher et al. | 437/195 |
| 5,196,724 | 3/1993 | Gordon et al. | 257/530 |
| 5,233,217 | 8/1993 | Dixit et al. | 257/530 |
| 5,242,851 | 9/1993 | Choi | 437/49 |
| 5,248,632 | 9/1993 | Tung et al. | 437/195 |
| 5,272,101 | 12/1993 | Forouhi et al. | 437/50 |
| 5,290,734 | 3/1994 | Boardman et al. | 437/195 |
| 5,300,456 | 4/1994 | Tigelaar et al. | 437/195 |
| 5,322,812 | 6/1994 | Dixit et al. | 437/60 |

FOREIGN PATENT DOCUMENTS

| | | | |
|---|---|---|---|
| 0041770 | 12/1981 | European Pat. Off. | G11C 17/00 |
| 0224418 | 6/1987 | European Pat. Off. | H01L 27/10 |
| 0414361 | 8/1989 | European Pat. Off. | H01L 23/52 |
| 0416903 | 3/1991 | European Pat. Off. | H01L 21/3205 |
| 0501120 | 9/1992 | European Pat. Off. | H01L 23/525 |
| 85/03599 | 8/1985 | WIPO | H01L 29/68 |
| 92/13359 | 8/1992 | WIPO | H01L 21/285 |
| 92/20109 | 11/1992 | WIPO | H01L 45/00 |
| 93/03499 | 2/1993 | WIPO | H01L 23/525 |

*Primary Examiner*—Jey Tsai
*Attorney, Agent, or Firm*—D'Alessandro & Ritchie

[57] ABSTRACT

A method for fabricating the antifuse of the present invention comprises the steps of forming a lower antifuse electrode; forming a relatively thick interlayer dielectric layer over the surface of the lower antifuse electrode; forming a masking layer, preferably a photoresist, including an aperture therein having a first area over the interlayer dielectric layer; performing a first vertical etching step on the interlayer dielectric layer to a first selected depth; enlarging the aperture in the masking layer until it has a second area; performing a final vertical etching step on the interlayer dielectric layer to expose the upper surface of the lower electrode. Depending on the thickness of the interlayer dielectric, additional enlarging steps and vertical etching steps may be performed prior to the final vertical etching step which exposes the upper surface of the lower electrode. An aperture having a staircase profile is thereby formed, the aperture having a number of steps thus reducing and/or eliminating cusping and/or thinning at the corner and bottom of the antifuse cell opening allowing for the uniform deposit of dielectric and upper antifuse electrode materials.

2 Claims, 4 Drawing Sheets

METHOD FOR FABRICATING AN ELECTRICALLY PROGRAMMABLE ANTIFUSE

CROSS-REFERENCE TO RELATED APPLICATION

This is a divisional of patent application Ser. No. 08/292,801, filed Aug. 10, 1994, now U.S. Pat. No. 5,550,404, which is a file-wrapper-continuation of patent application Ser. No. 08/065,530, filed May 20, 1993, now abandoned.

BACKGROUND OF THE INVENTION

1. Field of the Invention

The present invention relates to electrically programmable antifuse devices and methods of manufacture thereof. More particularly, the present invention relates to a an electrically programmable antifuse employing an antifuse aperture having a staircase profile and to methods for manufacturing such an antifuse.

2. The Prior Art

Integrated circuits which can be configured or programmed by the user for a specific application are becoming increasingly popular. These circuits may take numerous forms, such as programmable read only memory (PROM) devices and field programmable gate array (FPGA) devices. These devices may be electrically programmed by a user by either selectively breaking or creating a series of programmable links. Programmable links are electrical interconnects in the packaged integrated circuit which are broken or created by the user programming selected electronic nodes. Such programming is undertaken in order to activate or deactivate, respectively, selected electronic nodes such that the programmed device may perform a desired function.

Antifuse links are used extensively in user-programmable circuits and are well known. Antifuse links consist of typically two conductor and/or semiconductor electrodes separated by a layer of dielectric or other antifuse material. An antifuse link is an open circuit in its unprogrammed state. The programming mechanism for an antifuse creates a short circuit or relatively low resistance link between a transistor or other electronic node and the lattice network in the typical user-programmable circuits. During programming, the antifuse material between the electrodes is broken down by a current developed from a predetermined programming voltage applied to the electrodes of the selected antifuse links. A conductive filament is thereby formed which electrically connects the electrodes to create a short circuit or relatively low resistance path.

Antifuse elements such as those disclosed in U.S. Pat. No. 4,823,181 and U.S. Pat. No. 5,057,451 are extremely useful in user-programmable devices due to their extremely small size. All that is required in forming an effective antifuse is that the antifuse material layer between the two electrodes, when disrupted by a high electric field, will break down to produce a conductive filament. The size of the conductive filament is generally a function of the programming voltage pulse and the composition of the dielectric structure of the antifuse.

In any circuit containing a plurality of antifuse elements, it is crucial to minimize the capacitance of the unprogrammed antifuses. Each unprogrammed antifuse comprises two electrodes separated by a dielectric material, i.e., a capacitor. Therefore a plurality of unprogrammed antifuses on a single line of a matrix will act as a plurality of capacitors connected in parallel, wherein the capacitance of the line will be the sum of the capacitance of all of the unprogrammed antifuses. Accordingly, the larger the capacitance, the slower the data signals will pass down the line, thus greatly impairing device speed. It is therefore essential to minimize the capacitance of each antifuse element in order to insure proper device operation. This is usually accomplished by separating the electrodes by a relatively thick interlayer dielectric (ILD).

Additionally, in order to insure reliable device operation over life, the antifuse must be manufactured in such a way so as to emulate a high impedance (open circuit) while unprogrammed and maintain a low impedance (short circuit) after programming. This requires minimizing the leakage currents that flow in unprogrammed (open) antifuses between the two electrodes. Alternatively in the programmed state, the antifuse and resultant conductive filament must offer high electromigration immunity thereby maintaining the low resistance conductive path through the programmed antifuse for the operating life of the device.

Finally, the antifuse links must be manufactured so as to remain reliable at both the high programming voltages on the order of 10 to 18 volts (and resultant current flows) while maintaining the steady state reliability at normal operating voltages of 5 volts. The steady state reliability requirement necessarily requires a small programming voltage distribution range over all antifuse elements in the given integrated circuit device.

Antifuses may be fabricated using standard semiconductor processing techniques. The lower conductor is covered with an insulating material, typically a silicon dioxide layer, into which a window is etched in the region where it is desired to form the antifuse. This window is typically formed with vertical or slightly tapered edges at the top of the cell opening. The antifuse dielectric is then formed in the window region and is covered by one or more of conductive layers which will serve as the upper electrode.

The actual vertical conductive area of a programmed antifuse is relatively small. In order to maximize circuit performance, it is desirable to make the antifuse dielectric window area as small as possible to minimize the capacitance contributed by the antifuses which are to remain unprogrammed in the finished circuit.

The desire to minimize the area of the dielectric window is counterbalanced, however, by the inherent limitations in semiconductor processing techniques in providing uniform deposits in subsequent dielectric and top electrode formation of the antifuse. At some point, the dielectric window area becomes so small that subsequent deposits cannot easily fill the small opening and a shallowing effect will result. The resultant deposition will be subject to overhang at the top edge of the cell opening and cusping at the bottom of the cell. This shallowing effect will necessarily result in thinning of the top electrode in the cell opening requiring a greater barrier requirement for the top electrode to minimize leakage currents or a resultant poorer leakage current performance. Additionally, the nonuniform depositions of the dielectric and top electrode will result in poorer electromigration immunity, lower breakdown voltages in the dielectric, and wider breakdown voltage distribution throughout the antifuse lines.

Current design techniques have either suffered with these performance parameters or opened up the tolerances on the cell opening to minimize this effect, and necessarily increased the overall capacitance of the device thus slowing performance.

In order to overcome the disadvantages of the prior art antifuses while maintaining the low capacitance of the small cell opening devices, it is the object of the present invention to provide an electrically programmable antifuse including a staircase profile cell opening that provides for more uniform coverage of subsequent depositions in the antifuse production process.

A further object of the invention is to provide a method for fabricating the staircase profile cell opening antifuse of the present invention.

BRIEF DESCRIPTION OF THE INVENTION

According to a first aspect of the present invention an antifuse comprises a lower electrode and an upper electrode separated by an interlayer dielectric. An antifuse cell opening is disposed in the interlayer dielectric. The antifuse cell opening comprises at least two steps, wherein a first portion thereof has a first area and a second portion thereof disposed above the first portion has a second area larger than the first area. Additional portions may be provided above the second portion having successively larger areas if the thickness of the interlayer dielectric warrants their inclusion.

According to a second aspect of the present invention, a method for fabricating the antifuse of the present invention comprises the steps of forming a lower antifuse electrode; forming a relatively thick interlayer dielectric layer over the surface of the lower antifuse electrode; forming a masking layer, preferably a photoresist, including an aperture therein having a first area over the interlayer dielectric layer; performing a first vertical etching step on the interlayer dielectric layer to a first selected depth; enlarging the aperture in the masking layer until it has a second area; performing a final vertical etching step on the interlayer dielectric layer to expose the upper surface of the lower electrode. Depending on the thickness of the interlayer dielectric, additional enlarging steps and vertical etching steps may be performed prior to the final vertical etching step which exposes the upper surface of the lower electrode. An aperture having a staircase profile is thereby formed, the aperture having a number of steps thus reducing and/or eliminating cusping and/or thinning at the corner and bottom of the antifuse cell opening allowing for the uniform deposit of dielectric and upper antifuse electrode materials.

According to a presently preferred embodiment of the invention, a first vertical etching step is performed to remove about one half of the thickness of the interlayer dielectric, and second and third vertical etching steps are performed to each remove about one quarter of the thickness of the interlayer dielectric.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

The structure of and materials used to form the layers of the antifuses of the present invention, and the processes used to fabricate them, may be chosen from among the many variations of existing technology. Non-exhaustive examples of that technology, which are by way of illustration only, and are not intended to be in any way limiting, include the technology disclosed in U.S. Pat. No. 4,823,181, to Mohsen et al., issued Apr. 18, 1989, U.S. Pat. No. 4,899,205, to Hamdy et al., issued Feb. 6, 1990; U.S. Pat. No. 5,070,384 to McCollum et al., issued Dec. 3, 1991; U.S. Pat. No. 5,181,096 to Forouhi et al., issued Jan. 19, 1993. These patents are expressly incorporated hereby by reference.

Figure 1A:
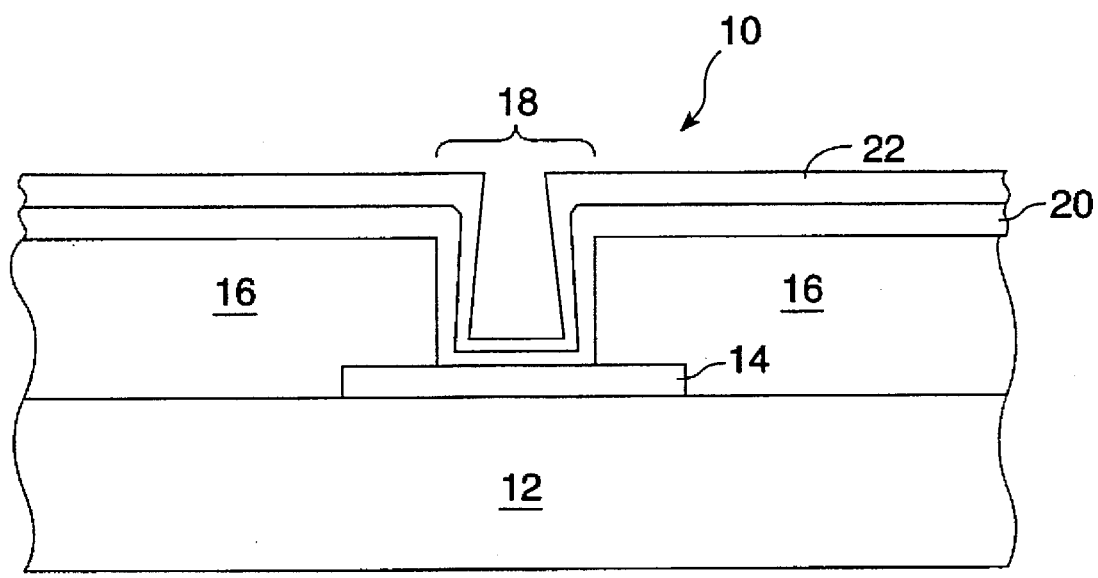
FIG. 1a is a cross sectional view of a typical prior art antifuse structure.

Referring first to FIG. 1a, a cross sectional view of the interlayer dielectric portion of a typical prior art antifuse structure is shown. The antifuse structure is formed on some sort of substrate 12, which may be a conductor, a semiconductor, or an insulating substrate. In FIG. 1a, an antifuse 10 is shown comprising a lower electrode 14 disposed on substrate 12, an interlayer dielectric 16 including an antifuse aperture 18, an antifuse material layer 20 disposed in the antifuse aperture 18 and in contact with the lower electrode 14, and an upper electrode 22.

Those of ordinary skill in the art will recognize that antifuse 10 may take various forms. For example, lower electrode 14 may comprise a doped region in a semiconductor substrate, a polysilicon layer, silicide or polysilicide layer, or a barrier layer or metal layer. Similarly, upper electrode 22 may be formed from a variety of materials, such as a polysilicon layer, silicide or polysilicide layer, or a barrier layer or metal layer.

As previously mentioned, it is desirable to provide an interlayer dielectric having a thickness sufficient to provide a low capacitance for the antifuse in its unprogrammed state. In addition, it is also desirable to provide a minimally sized antifuse aperture in order to obtain a finished circuit product which is as dense as possible.

It is known in the art that these two goals are often in conflict. As may be easily seen from FIG. 1a, as the antifuse aperture 18 decreases in size a shallowing effect occurs during the subsequent depositions of antifuse material layer 20 and upper electrode 22. The resultant is an overhang at the top edge of the antifuse aperture 18, and cusping at the bottom of the antifuse aperture 18 in the subsequent depositions. These artifacts of the manufacturing process are likely to result in the performance deficiencies previously enumerated.

According to the present invention, an antifuse structure and method for fabricating that structure are provided. The antifuse of the present invention reduces or even eliminates the problems exhibited by prior art antifuses.

Figure 1B:
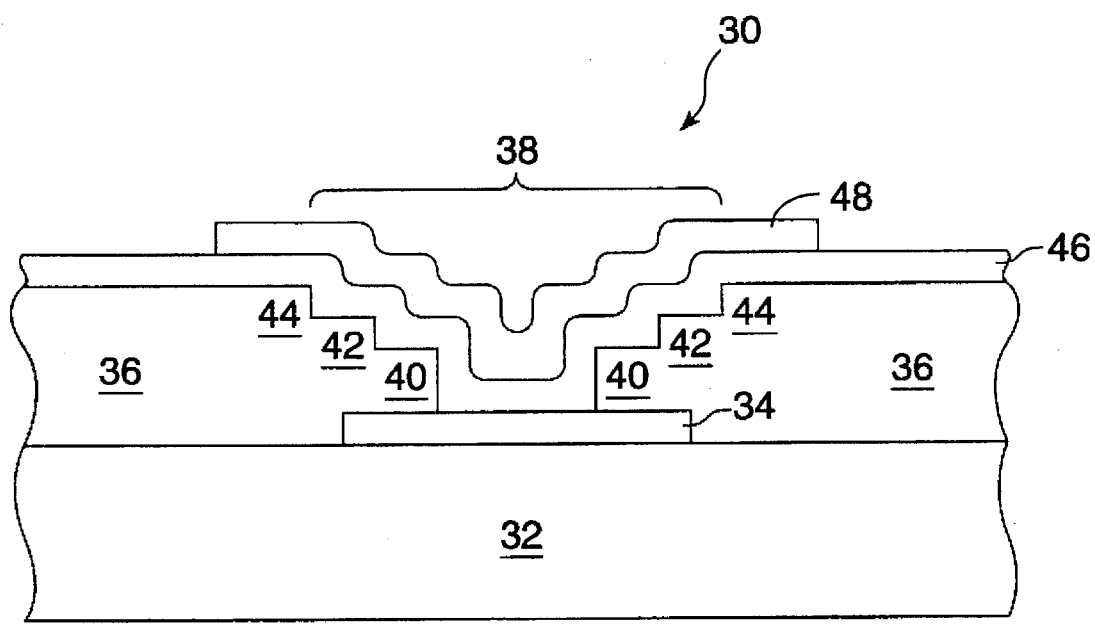
FIG. 1b is a cross-sectional view of an antifuse structure according to a presently preferred embodiment of the invention.

Referring now to FIG. 1b, a cross sectional view of an antifuse fabricated according to a presently preferred embodiment of the invention is presented. Antifuse 30 of FIG. 1b is fabricated on a substrate 32 and includes a lower electrode 34. An interlayer dielectric layer 36 is disposed over lower electrode 34. Lower electrode 34 and interlayer dielectric layer 36 may be formed from known materials. As in the prior-art antifuse 10 of FIG. 1a, lower electrode 34 of antifuse 30 may comprise a doped region in a semiconductor substrate.

As may be seen from an examination of FIG. 1b, antifuse aperture 38 of antifuse 30 is a more complex structure than the antifuse aperture 18 of prior-art antifuse 10. More particularly, antifuse aperture 38 has a stair-step cross section, in that it comprises a first area adjacent to the lower electrode 34 over a first portion 40 of the thickness of the interlayer dielectric layer 36, a second area larger than the first area over a second portion 42 of the thickness of the interlayer dielectric layer 36 disposed immediately above the first portion, and a third area larger than the second area over a third portion 44 of the thickness of the interlayer dielectric layer 36 disposed immediately above the second portion.

A layer of antifuse material 46 is disposed in antifuse aperture 38 in contact with the lower electrode 34. An upper electrode 48 is disposed over the layer of antifuse material 46. Antifuse material 46 and upper electrode 48 may be formed from materials known for use in antifuse applications.

Figure 2A:
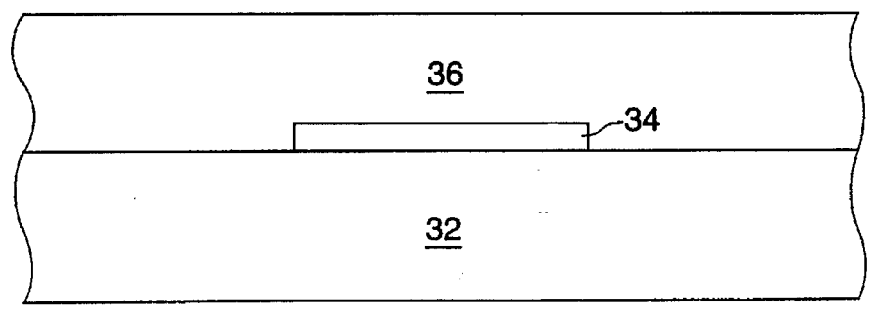
FIG. 2a–2h are cross sectional views of an antifuse structure according to a presently preferred embodiment of the invention shown at selected points during the fabrication process.

Referring now to the cross sectional diagrams of FIGS. 2a–2h, the structure of antifuse 30 according to the present invention will be shown after performance of selected steps in the fabrication process. Referring first to FIG. 2a, the antifuse 30 of the present invention is shown after lower electrode 34 and interlayer dielectric layer 36 have been formed on substrate 32. If substrate 32 is formed from a non-conducting material, lower electrode 34 may be formed directly on its surface, or over an intervening adhesion promoting layer. Although lower electrode 34 is shown in FIGS. 2a–2h as a layer formed over substrate 32, those of ordinary skill in the art will recognize that lower electrode 34 may comprise a doped region in a semiconductor substrate or may comprise one of a number of different materials, such as metals, barrier layers, polysilicon, polysilicides, etc. Methods for forming the lower electrodes disclosed or suggested herein are well understood by those of ordinary skill in the art. Interlayer dielectric layer 36 may likewise comprise a number of materials. CVD oxide, formed using well known techniques, is commonly employed.

Figure 2B:
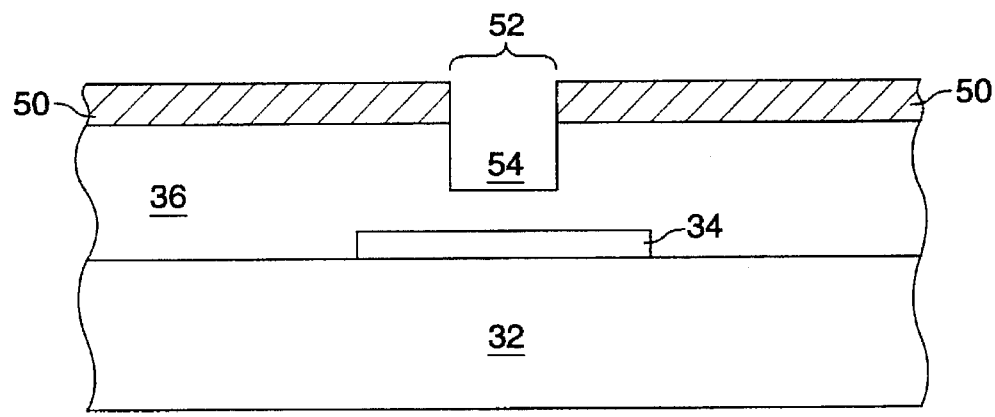

Referring now to FIG. 2b, a masking layer 50, which usually comprises a photoresist layer, is placed over the surface of the interlayer dielectric layer 36. First masking layer 50 includes a first-sized aperture 52 having dimensions selected such that an antifuse aperture having a first area is produced when a vertical etching process is performed to a selected depth. For a typical present-day antifuse, this aperture may have a size of about 0.8 microns, although those of ordinary skill in the art will recognize that other sizes may be employed and that progress in processing technology will allow smaller features to be reproduced in the future.

A first vertical etching step is performed to form a first-sized portion 54 in the interlayer dielectric layer 36. As presently preferred, this first-size portion 54 is etched through about one half of the thickness of interlayer dielectric layer 36. As will be appreciated by those of ordinary skill in the art, such an etching step may be performed using a fluorine-based chemistry. FIG. 2b shows the structure resulting after the formation of first-sized portion 54 in the interlayer dielectric layer 36.

Figure 2C:
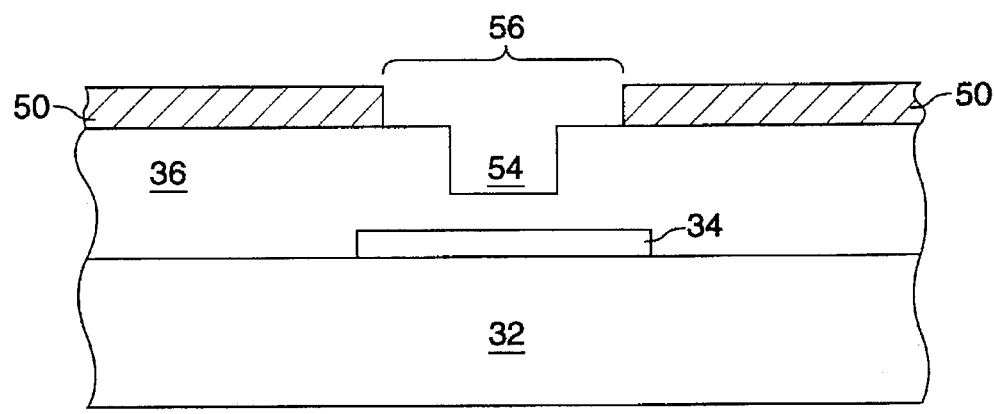

Referring now to FIG. 2c, the differences between prior art antifuses and the antifuse of the present invention will begin to be seen. In a conventional antifuse fabrication process, an antifuse aperture would be etched through the entire thickness of interlayer dielectric layer 36 in a single step to expose the upper surface of lower electrode 34. The next step would be to remove the masking layer 50 and prepare to form a layer of antifuse material in the antifuse aperture as is conventionally done in the prior art. According to the present invention, however, the masking layer 50 remains in place. An etching step is performed to enlarge the mask aperture to form a second-sized aperture 56 in masking layer 50. For example, when the initial mask aperture is 0.8 microns, the first mask-aperture etching step may be used to enlarge it to about 1.2 microns. The first mask-aperture etching step may be performed by several known etching techniques, although an $O_2$ plasma etch is presently preferred to create second-sized aperture 56 in masking layer 50 without any further etching of the first-sized portion 54 in interlayer dielectric layer 36.

Figure 2D:
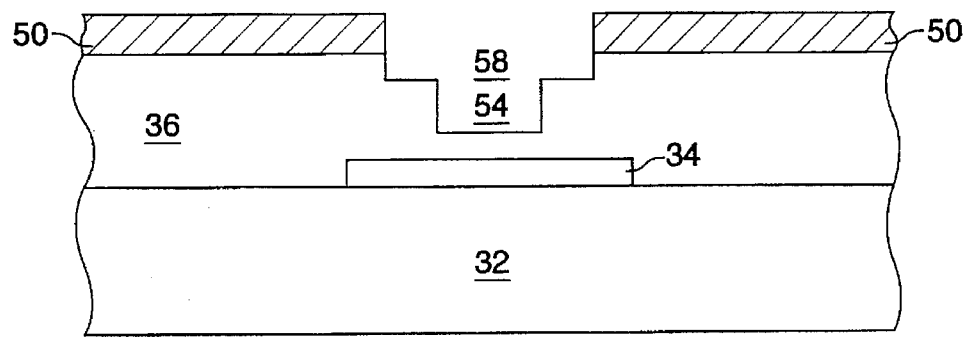

Next, as shown in FIG. 2d, a second vertical etching step is performed to form a second-sized portion 58 of the antifuse aperture in the interlayer dielectric 36. As presently preferred, this second-sized portion 58 of the antifuse aperture is etched through about one quarter of the thickness of interlayer dielectric layer 36. As will be appreciated by those of ordinary skill in the art, such an etching step may be performed using a fluorine-based chemistry.

Those of ordinary skill in the art will appreciate that, because of the vertical nature of the etch process, the second vertical etching step has the effect of extending the depth of the of the first-sized portion 54 of the antifuse aperture by a like amount. FIG. 2d shows the structure resulting after the formation of second-sized portion 58 and the extension of the depth of the first-sized portion 54 of the antifuse aperture in the interlayer dielectric layer 36.

Figure 2E:
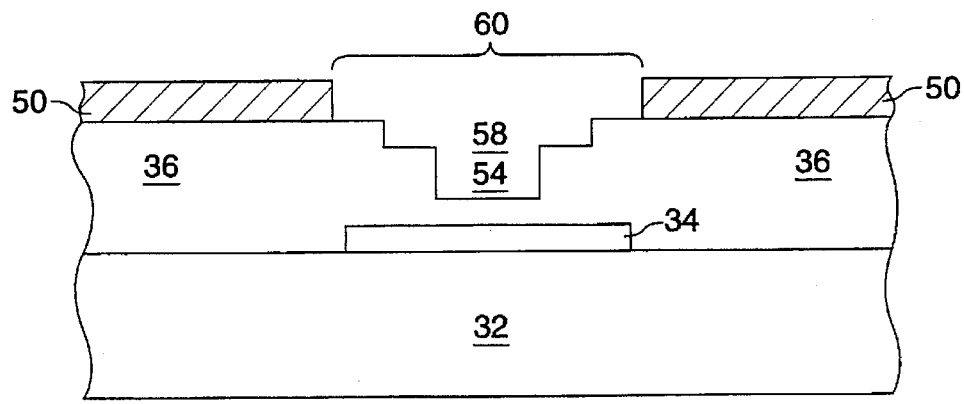

Referring now to FIG. 2e, a second mask-aperture etching step is used to enlarge the mask aperture even further to form a third-sized mask aperture 60. For example, when the initial mask aperture is 0.8 microns and the first mask-aperture etching step has been used to enlarge it to about 1.2 microns, the second mask aperture etching step may be used to enlarge it to about 1.5 to 1–6 microns. As with the first mask aperture etching step, the second mask-aperture etching step is preferably performed by an $O_2$ plasma etch to create third-sized mask aperture 60 without any further etching of the second-sized portion 58.

Figure 2F:
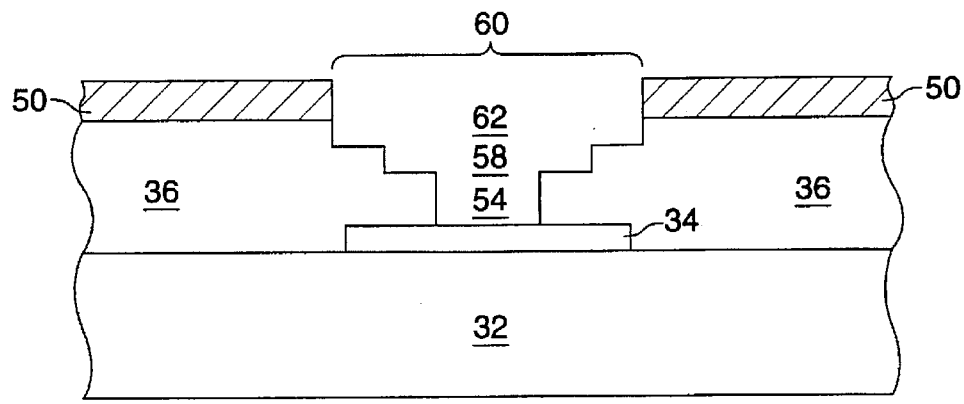

Next, as shown in FIG. 2f, a third vertical etching step is performed to form a third-sized portion 62 of the antifuse aperture in the interlayer dielectric layer 36. As presently preferred, this portion of the antifuse aperture is etched through about one quarter of the thickness of interlayer dielectric layer 36.

As will be appreciated by those of ordinary skill in the art, because of the vertical nature of the etch process, the third vertical etching step has the effect of extending the depth of the of both the first-sized portion 54 and second-sized portion 58 of the antifuse aperture such that the first-sized portion 54 will extend through to expose the upper surface of underlying lower antifuse electrode 34. Those of ordinary skill in the art will recognize that, where the lower electrode 34 is a metal or is covered by a good barrier material such as TiN, $TiWN_x$, Ti, etc., and a fluorine based etch chemistry is used, the etching step will have a minimal effect on the surface of the lower electrode 34.

In instances where the upper surface of the lower electrode will be attacked by the fluorine chemistry of the etch process, an insulating layer formed from a combination of silicon dioxide and nitride using known semiconductor processing techniques, may be placed over the surface of the lower antifuse electrode 34 prior to formation of the interlayer dielectric layer 36. Such a layer provides an etch stop for the interlayer dielectric etch to minimize the damage to the lower electrode 34. FIG. 2f shows the structure resulting after the formation of third-sized portion 62 in the interlayer dielectric 36.

Figure 2G:
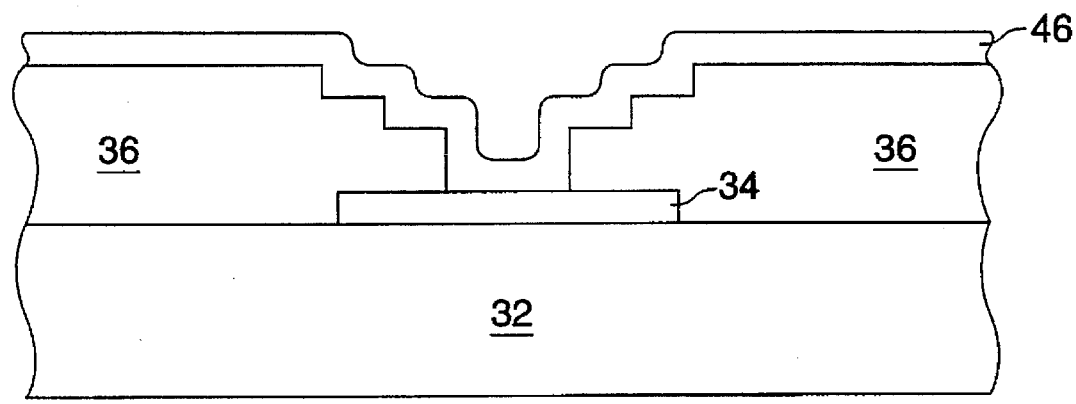

Referring now to FIG. 2g, the photoresist layer 50 has removed in preparation for the deposition of antifuse material layer 46. Antifuse material layer 46 is then formed from a material selected from a variety of known antifuse materials, such as amorphous silicon or single or multiple layers of various dielectric materials as is known in the art.

Figure 2H:
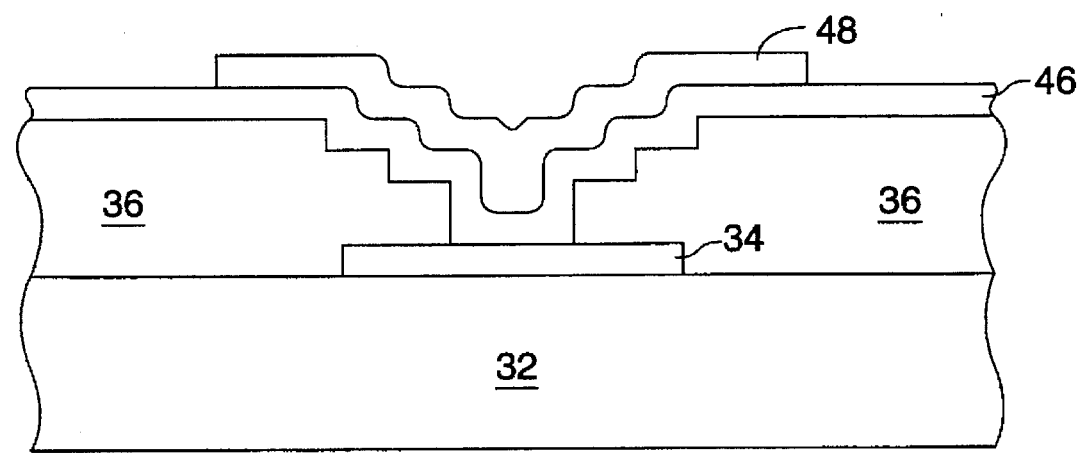

Referring now to FIG. 2h, the upper antifuse electrode 48 is formed and defined using known materials and processing technology. Where the antifuse comprises a metal-to-metal antifuse and the antifuse comprises a layer of amorphous silicon, those of ordinary skill in the art will recognize that a barrier layer must be interposed between the top and bottom electrodes 34 and 48 and the antifuse material layer 46 to prevent interdiffusion between the metal layers and the antifuse material.

If the finished antifuse of FIGS. 1b and 2h is compared with the prior-art antifuse of FIG. 1a, it will be seen that, because the stair-step type antifuse aperture of the antifuse 30 of the present invention is much wider than the traditional vertical or tapered aperture, it is easier to form a uniformly thick antifuse material layer 46 and upper electrode 48. The resulting antifuse does not exhibit cusping and the other phenomena associated with depositions into deep apertures, resulting in better dielectric-breakdown and leakage characteristics. Because of the improved step coverage, the breakdown voltage of the antifuse material layer 46 is higher. In addition, the breakdown voltage distribution is tighter.

As previously mentioned, the antifuse of the present invention includes embodiments wherein the lower electrode comprises a doped region in a semiconductor substrate, as well as embodiments in which the lower electrode is disposed in a layer located above and insulated from the surface of the semiconductor substrate. Such layers include polysilicon layers and metal layers, and known variations of such layers, such as where barrier metal layers are employed.

The present invention may be practiced using any material or combination of conductive materials for the upper and lower electrodes 48 and 34 and any material or combination of materials for the antifuse material layer 46. Selection criteria and techniques for the formation of such layers are well within the level of ordinary skill in the art.

Those of ordinary skill in the art will recognize that where the layers recited herein for the upper and lower electrodes are to be formed from materials, such as polysilicon or metals, which are normally utilized in semiconductor structures, these layers may have the thickness commonly employed for such layers in normal use in semiconductor structures.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for fabricating an antifuse comprising the steps of:

forming a lower antifuse electrode;

forming an interlayer dielectric layer over the surface of said lower antifuse electrode;

forming a masking layer, including an aperture therein having a first area, over the interlayer dielectric layer;

performing a first vertical etching step on the interlayer dielectric layer to a first selected depth;

enlarging the aperture in the masking layer until it has a second area;

performing a final vertical etching step on the interlayer dielectric layer to expose the upper surface of the lower electrode.

2. A method for fabricating an antifuse comprising the steps of:

forming a lower antifuse electrode;

forming an interlayer dielectric layer over the surface of said lower antifuse electrode;

forming a masking layer, including an aperture therein having a first area, over the interlayer dielectric layer;

performing a first vertical etching step on the interlayer dielectric layer to a first selected depth;

enlarging the aperture in the masking layer a first time until it has a second area larger than said first area;

performing a second vertical etching step on the interlayer dielectric layer to a second selected depth;

enlarging the aperture in the masking layer a second time until it has a third area larger than said second area;

performing a final vertical etching step on the interlayer dielectric layer to expose the upper surface of the lower electrode.

* * * * *